US005504375A

United States Patent [19]
Carlson et al.

[11] Patent Number: 5,504,375
[45] Date of Patent: Apr. 2, 1996

[54] ASYMMETRIC STUDS AND CONNECTING LINES TO MINIMIZE STRESS

[75] Inventors: William H. Carlson, Salt Point; Leathen Shi, Yorktown Heights; King-Ning Tu, Chappaqua, all of N.Y.

[73] Assignee: International Business Machines Corporation, Armonk, N.Y.

[21] Appl. No.: 155,492

[22] Filed: Nov. 18, 1993

Related U.S. Application Data

[63] Continuation of Ser. No. 844,349, Mar. 2, 1992, abandoned.

[51] Int. Cl.[6] .......................... H01L 23/48; H01L 29/46; H01L 29/54; H01L 29/62
[52] U.S. Cl. .......................... 257/758; 257/759; 257/760; 257/774
[58] Field of Search .................................. 257/774, 736, 257/737, 758, 759, 760, 781

[56] References Cited

U.S. PATENT DOCUMENTS

| | | | |
|---|---|---|---|
| 3,874,072 | 4/1975 | Rose | 29/578 |
| 4,582,563 | 4/1986 | Hazuki et al. | 156/643 |
| 4,614,021 | 9/1986 | Hulseweh | 29/590 |
| 4,905,068 | 2/1990 | Satoh et al. | 257/759 |
| 4,908,690 | 3/1990 | Hata et al. | 257/758 |
| 4,914,056 | 4/1990 | Okumura | 437/192 |
| 4,960,489 | 10/1990 | Roeska et al. | 156/652 |
| 5,025,303 | 6/1991 | Brighton | 257/759 |
| 5,034,799 | 7/1991 | Tomita et al. | 257/758 |
| 5,063,175 | 11/1991 | Broadbent | 257/774 |

FOREIGN PATENT DOCUMENTS 61-287138  12/1986  Japan ..................... 257/758

OTHER PUBLICATIONS

S. Mayumi, et al, "The Effect of Cu Addition to Al–Si Interconnects on Stress Induced Open–Circuit Failures", 1987 IEEE/IRPS, pp. 15–21.

K. Hinode et al, "Stree–Induced grain boundary fractures in Al–Si interconnects", J. Vac. Sci. Technol. B5(2), 518 (1987).

J. W. McPherson et al "A model for stress–induced metal notching and voiding in very large–scale–integrated Al–Si (1%) metallization", J. Vac. Sci. Technol. B5(5), 1321 (1987).

C. Y. Li et al "Analysis of thermal stress–induced grain boundary cavitation and notching in narrow Al–Si metallization", Appl. Phys. Lett. 53(1) 31 (1988).

T. Sullivan "Thermal dependence of voiding in narrow aluminum microelectronic interconnects", Appl. Phys. Lett. 55(23) 2399 (1989).

P. A. Flinn et al, "Measurement and Interpretation of Stress in Aluminum–Based Metalliztaion as a Function of Thermal History", IEEE Trans. on Electron Devices, vol. ED–34, No. 3, 689 (1987).

Q. Guo, et al "A stress induced diffusion model for failure of interconnects in microelectronic devices", Northwest University Research Report (1990).

*Primary Examiner*—Sara W. Crane
*Assistant Examiner*—Carl Whitehead, Jr.
*Attorney, Agent, or Firm*—Heslin & Rothenberg

[57] ABSTRACT

In the design of stud and conducting line joints, the conducting line is extended beyond the stud without any significant overhang of the line in the width direction for minimizing induced stress in order to reduce voids and crack growth in the region where the connecting line is joined to the stud. The preferred length of the extension is in the range approximately between one-quarter and twice the stud dimension. The design is applicable, but not limited to, multilevel integrated circuits used in computers and other electrical devices.

8 Claims, 5 Drawing Sheets

FIG. 1
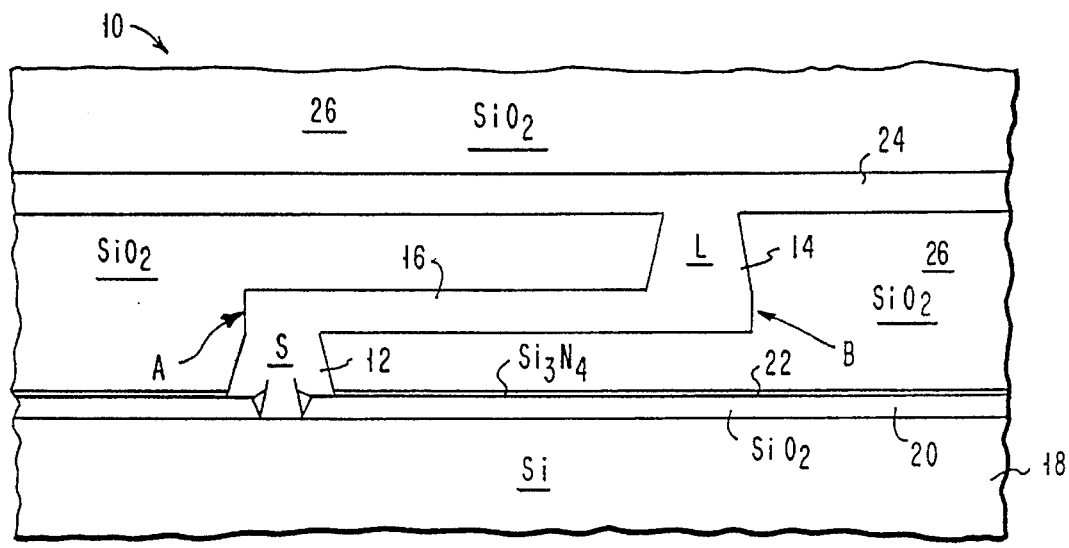
FIG. 2
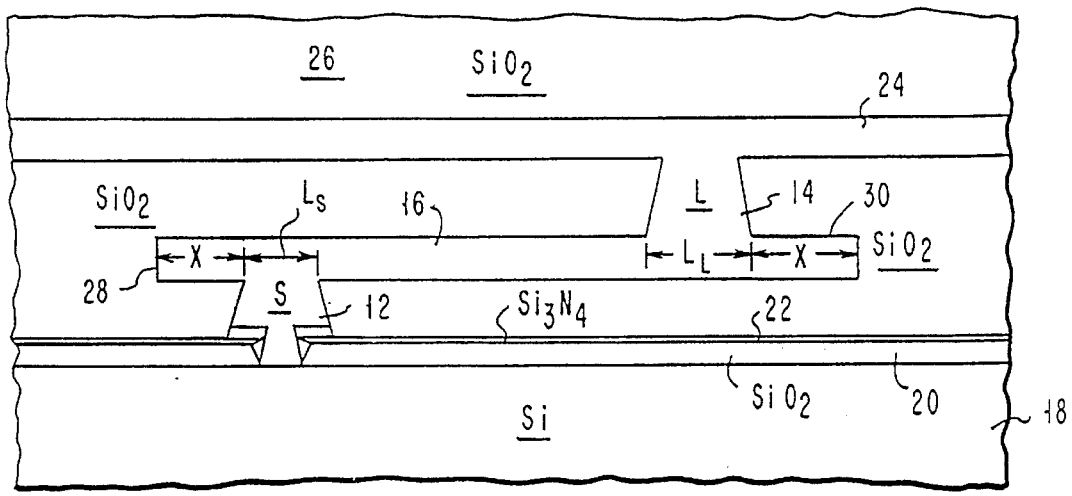
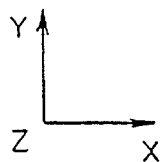

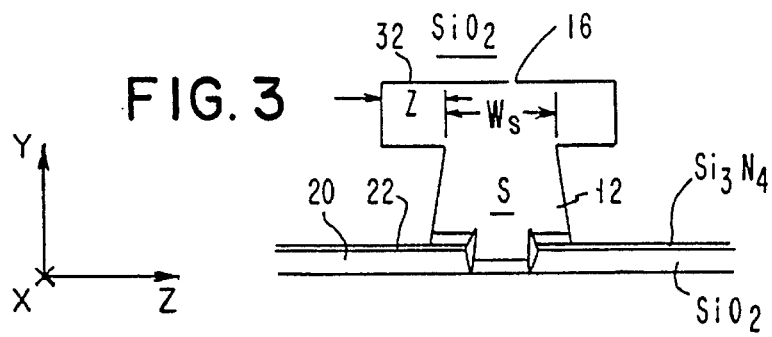
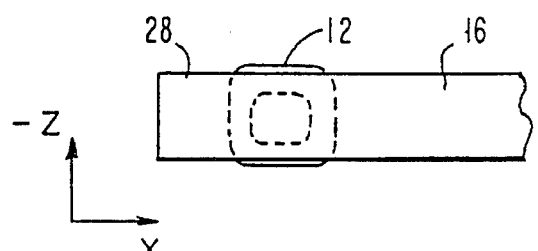
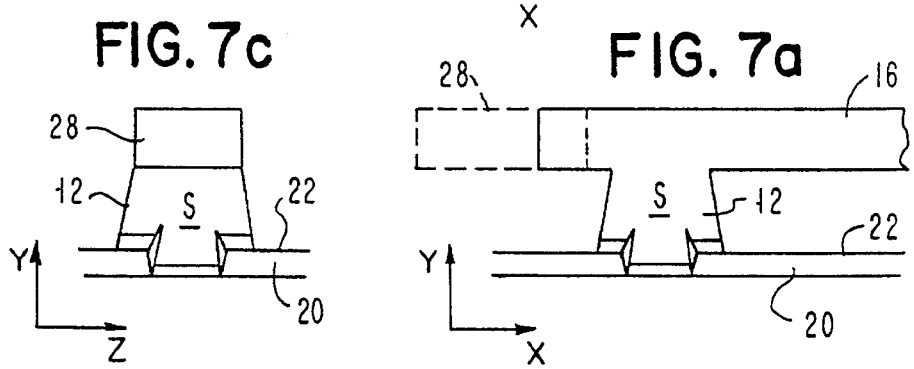
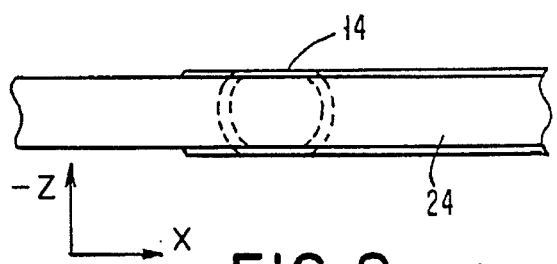
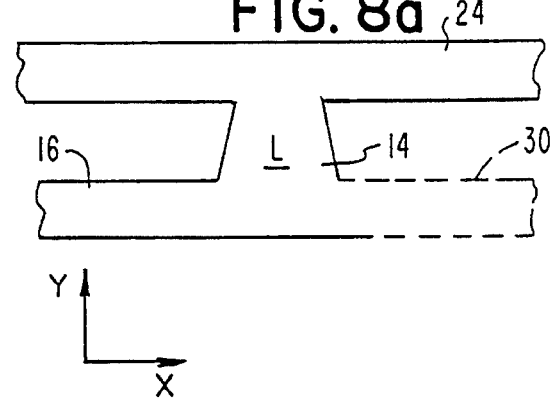

ASYMMETRIC STUDS AND CONNECTING LINES TO MINIMIZE STRESS

This application is a continuation of application Ser. No. 07/844,349, filed Mar. 2, 1992 now abandoned.

BACKGROUND OF THE INVENTION

The present invention relates to the design of studs and connecting line joints in multilayer electrical circuits and particularly, to the extending of the connecting line beyond an asymmetric stud in the length direction of the line without significant overhang of the line in the width direction of the line for minimizing induced stresses in order to reduce voids and crack growth in the region where the connecting line is joined to the stud.

In the manufacture of multilevel integrated circuits used in computers and other electrical devices, reliability is a constant concern. Poor reliability adversely impacts yield and results in a high incidence of field failures and product returns. Although there are a number of causes for such failures including contamination, corrosion, misalignment and so forth, experience has shown that in many instances the failure is due to the fracture of studs which connect metal conducting lines between circuit containing conductor levels of multilayer circuit structures. The fracture of the studs is a result of stress resulting from thermal mismatch between the conducting layer and the passivation layer during temperature excursion and from thermally activated voiding processes.

Thus, the reduction of the thermal stress is one of the most important factors in improving reliability. It has been discovered that most stud failures occur at the studs located in the vicinity of the end of the metal conducting line. Finite-element calculation performed by the inventors shows that the stress in the studs at the end of the metal conducting lines are approximately 20 to 40 percent higher than the stress in the studs located in the middle of the line. Therefore, reduction of the stresses in the studs at the end of the metal conducting lines is of utmost importance.

Finite-element modeling results and SEM micrographs also show that the voids formed in the studs are primarily caused by tensile normal or hydrostatic stresses. Moreover, the location for voids to grow depends on the range of the temperature excursion and the duration at a particular temperature to which the circuit is exposed. In addition to reducing stud failures by optimizing the thermal cycling of the fabrication process, which optimization tends to be process limited, the present invention provides for reduced stud failure by optimizing the design of the stud and metal conducting line joint.

SUMMARY OF THE INVENTION

It has been derived that the exact location where any voids grow is dependent upon the range of temperature excursion and the time spent at a particular temperature. It has also been discovered that enlarging the contact area of the stud does not reduce, but rather significantly increases the stresses. Furthermore, it has been found that an extension or overhang of the conducting line in the length direction of the line only, beyond the stud at the end of the line, results in a significant thermal stress reduction without causing an appreciable decrease in circuit density.

Significant stress reduction occurs in the conducting line when the overhang extension is approximately one-quarter to one-half of the stud dimension without significantly affecting the circuit density. Maximum stress reduction occurs when the line extension is up to one and one-half to two times the stud dimension.

When high circuit density is critical, for instance in memory arrays, a shorter length extension is preferred. On the other hand, when circuit density is not as critical a factor, a larger length extension is preferred.

A principal object of the present invention is therefore, the provision of a stud and connecting line joint design which minimizes stress at the joint region.

A further object of the invention is the provision of a stud and conducting line joint design where the conducting line extends beyond the stud in the length direction of the line.

Another object of the invention is the provision of a stud and conducting line joint design where the conducting line extends beyond the stud in the length direction of the line but without significant overhang in the width direction of the line.

Further and still other objects of the present invention will become more clearly apparent when the following description is read in conjunction with the accompanying drawing.

BRIEF DESCRIPTION OF THE DRAWINGS

FIG. 1 is a schematic diagram of a 2-D model of a multilayer circuit with studs located at the ends of a conducting line;

FIG. 2 is a schematic diagram of a 2-D model of a multilayer circuit showing the extension of the conducting line in the length direction of the line;

FIG. 3 is a schematic diagram of a multilayer circuit showing the portion of the conducting line width beyond the stud;

FIG. 7a is a schematic diagram of a side elevation view of a S-type stud connected to a conducting line where the conducting line extends beyond the stud in the length direction of the line;

FIG. 7b is a schematic diagram of a plan view of the connection shown in FIG. 7a;

FIG. 7c is a schematic diagram of an end view of the connection shown in FIG. 7a;

FIG. 8 is a schematic diagram of a side direction view of a L-type stud connected to a conducting line when the conducting line extends beyond the stud in the length direction of the line;

FIG. 8b is a schematic diagram of a plan view of the connection shown in FIG. 8a; and FIG. 8c is a schematic diagram of an end view of the connection shown in FIG. 8a.

DETAILED DESCRIPTION

Figure 4:
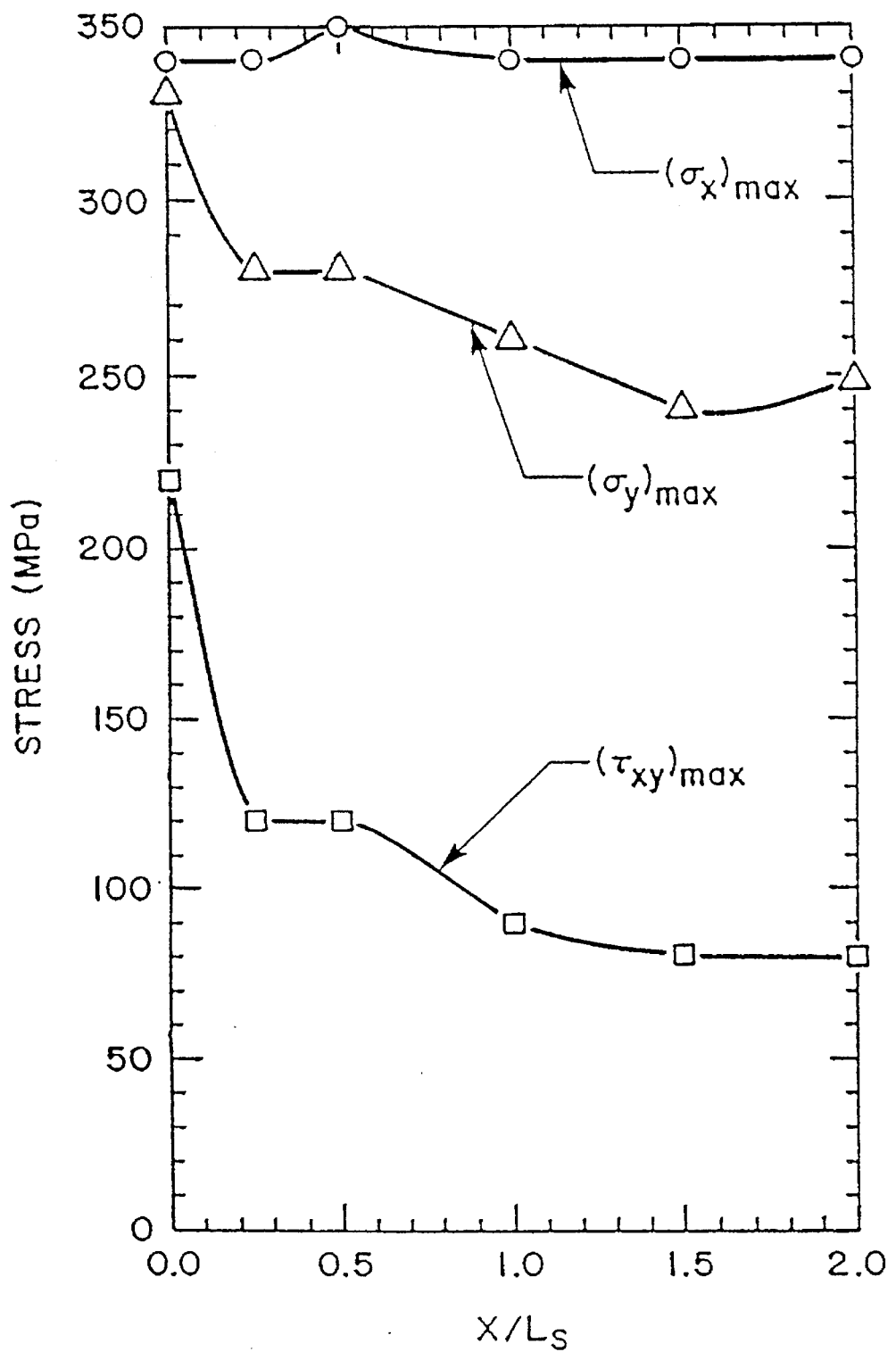
FIG. 4 is a graphical representation of the stress as a function of the length of a conducting line extension beyond a S-type stud in the direction of the line length.

While the invention is most applicable to multilayer circuits used in bi-polar chips in mainframe computers, the broad concepts and applicability of the invention applies to any electrical component where a conducting line is connected to a stud and both the connecting line and stud are contained in a passivation layer.

Referring now to the figures and to FIG. 1 in particular there is shown a schematic drawing of a 2-D model of a multilayer circuit 10 with asymmetric trapezoidal shaped studs 12, 14 located at the ends of a metal conducting line 16.

Stud 12, referred to as a S-type stud, connects a silicon substrate layer 18 to one end of metal conducting line 16. The conducting line is preferably Al/Cu, but may be any conventional conductor material used in multilayer circuit fabrication. A layer of quartz 20 ($SiO_2$) is deposited on the surface of silicon substrate 18. A layer of silicon nitride 22 ($Si_3N_4$) is then deposited on the quartz layer 20. The stud 12 extends through the silicon nitride and quartz layers to the silicon substrate.

Stud 14, referred to as a L-type stud, connects the other end of the metal conducting line 16 to a metal conducting line 24 in the next layer. The metal conducting line 24 is preferably Al/Cu, but may be any conventional conductor material used in multilayer circuit fabrication.

In conventional multilayer circuits, quartz 26 is used for passivation and embedding of the metal conducting lines and the studs. However, other passivation material such as glass, polyimide and the like can also be used.

FIGS. 2 and 3 schematically show a modification of the multilayer circuit shown in FIG. 1. In FIG. 2 overhang extensions of the metal conducting lines in the length direction (x-axis) of the conducting line 16 have been added as extension 28 in the vicinity of stud 12 and as extension 30 in the vicinity of stud 14. FIG. 3 shows an extension 32 of the metal conducting line in the width direction (z-axis) of the conducting line in the vicinity of stud 12.

Each stud has a contact dimension in the length direction of the conducting line 16. In FIG. 2, the stud 12 has a dimension at the top of stud where a joint is to be formed with the conducting line 16 in the length direction, parallel to the x-axis as shown, of $L_S$. Similarly, stud 14 has a dimension at the bottom of the stud where a joint is to be formed with the conducting line 16 in the length direction of $L_L$. Each stud also has a contact dimension where a joint is to be formed with the conducting line 16 in the width direction of the conducting line, parallel to the z-axis as shown in FIG. 3 and in the case of the stud 12 of dimension $W_S$.

Figure 5:
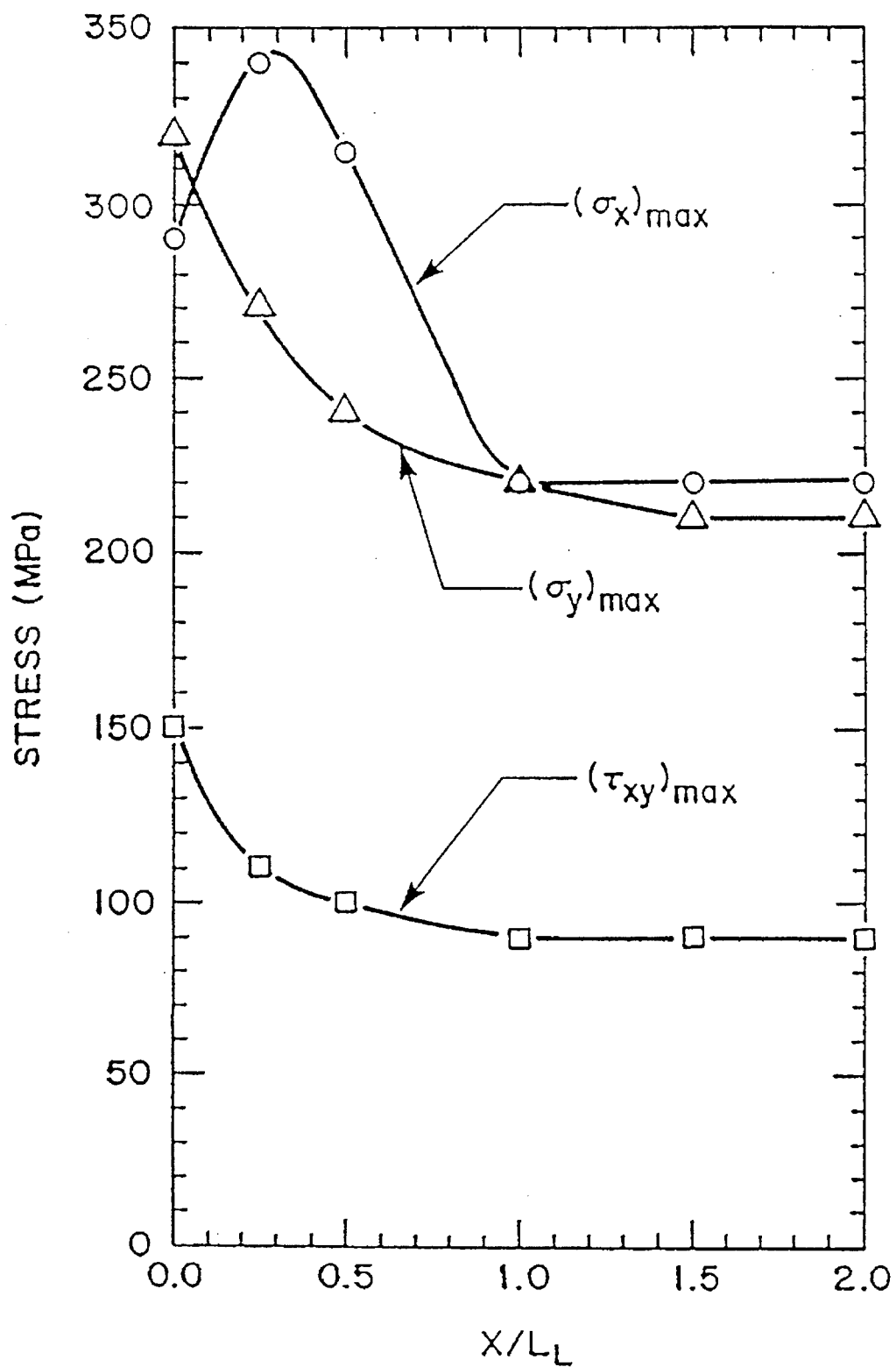
FIG. 5 is a graphical representation of the stress as a function of the length of a conducting line extension beyond L-type stud in the direction of the line length.

FIGS. 4 and 5 graphically illustrate the maximum stress components $\sigma_x, \sigma_y$ and $\tau_{xy}$ as a function of the ratio of the length of the extension (x) of the conducting line beyond the stud and the dimension of the stud in the length dimension, $L_S$ and $L_L$ for stud 12 and stud 14 respectively. The values $\sigma_x$ and $\sigma_y$ are the stress concentration components along the x-axis and y-axis respectively. The value $\tau_{xy}$ is the shear stress.

FIGS. 4 and 5 show that $\sigma_y$ and $\tau_{xy}$ monotonically decrease as the length of the extension increases and reaches a minimum value when the length of the extension is approximately one and one-half times the stud dimension. Based upon the stud geometry shown, the stud stiffness in the x-axis direction is much higher than the stud stiffness in the y-axis direction. In the case of S-type studs, according to calculations, the x-axis direction stiffness is in the range of approximately 2 to 26 times greater than the y-axis direction stiffness. In the case of the L-type stud, calculations show that the x-axis direction stiffness is in the range of approximately 2 to 5 times greater than the y-axis direction stiffness.

Therefore, the y-axis direction stress, $\sigma_y$, is the more critical stress component to control than the x-axis direction stress, $\sigma_x$. Calculations and examination of failed components confirm that the prominent failure modes are related to the y-axis direction stress component $\sigma_y$ and the shear stress $\tau_{xy}$. It should also be noted from FIGS. 4 and 5 that significant stress reduction is manifest when the extension of the conducting line length is in the range of approximately one-quarter to one-half of the stud dimension for both S-type and L-type studs. Thus, even a relatively short extension of the conducting line in the length direction of the line can provide a significant improvement in reliability with only a minimal impact or decrease in circuit density. This result is particularly significant in the manufacture of memory arrays. However, when designing multilayer circuits where circuit density is a less important consideration, the length of the line extension in the length direction of the line can be made up to approximately one and one-half to two times the stud dimension in order to take maximum advantage of the stress reduction afforded by practicing the present invention.

Figure 6:
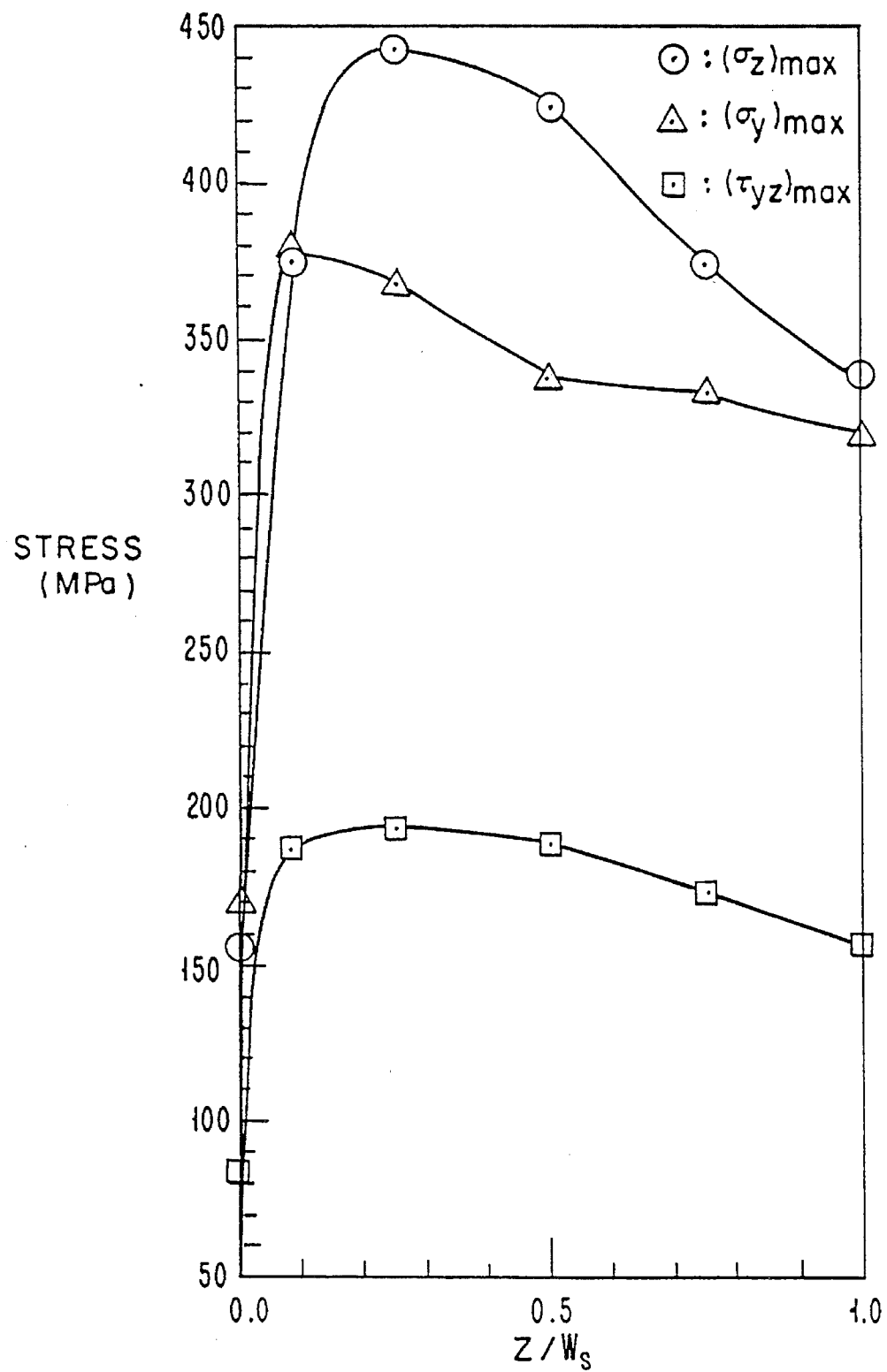
FIG. 6 is a graphical representation of the stress as a function of the length of a conducting line extension beyond the S-type stud in the direction of the line width.

FIG. 6 graphically illustrates the maximum stress components of the stress applied to the stud as a function of the ratio of the width of an extension (z) of the conducting line beyond a S-type stud in the direction of the line width and the stud width dimension $W_S$. The stress actually increases when a short extension is added to the conducting line. Therefore, it is preferably to have no significant extension of the conducting line in the direction of the conducting line width.

FIGS. 7a, 7b, and 7c schematically illustrate the preferred design of a S-type stud 12 and metal connecting line 16 with line extension 28 only in the direction of the line length (x-axis) and substantially without any extension in the direction of the line width (z-axis). Similarly, FIGS. 8a, 8b and 8c schematically illustrate the preferred design of the L-type stud 14 and metal connecting line 16 with an extension 30 in the direction of the line length (x-axis) and substantially without an extension in the direction of the line width (z-axis).

While there has been described and illustrated a preferred embodiment of the present invention, it will be apparent to those skilled in the art that variations and modifications are possible without deviating from the broad scope of the present invention which shall be limited solely by the scope of the claims appended hereto.

What is claimed is:

1. An interconnection structure for reducing thermal stress in a multilayer circuit comprising:

a first electrically conductive stud having a first contact area;

a second electrically conductive stud having a second contact area;

a conducting line extending lengthwise along a first axis, said conducting line forming at a first end thereof a first joint with the first contact area of said first stud and forming at a second end thereof a second joint with the second contact area of said second stud;

passivation layer means disposed for embedding said first stud and said first joint, said second stud and said second joint, and said conducting line, said first and second studs being disposed in corresponding first and second vias in said passivation layer means;

the first end of said conducting line extending a first predetermined distance beyond said first contact area along said first axis, and the second end of said conducting line extending a second predetermined distance beyond said second contact area along said first axis, said first and second predetermined distances being chosen so as to reduce thermal stress at said first and second joints, respectively, while accommodating desired circuit density;

said first contact area having a first length dimension along said first axis, said second contact area having a second length dimension along said first axis, and said first predetermined distance being in the range of one-quarter to twice the first length dimension, and said second predetermined distance being in the range of one-quarter to twice the second length dimension; and said first contact area has a first width dimension along a second axis orthogonal to said first axis, said second contact area has a second width dimension along said second axis, and said conducting line has a width at said first joint substantially equal to said first width dimension and a width at said second joint substantially equal to said second width dimension.

2. The interconnection structure of claim 1 wherein said first predetermined distance is chosen to be in the range of one-quarter to one-half the first length dimension and said second predetermined distance is chosen to be in the range of one-quarter to one-half the second length dimension in order to accommodate high circuit density.

3. The interconnection structure of claim 1 wherein said first predetermined distance is chosen to be in the range of one and one-half to twice the first length dimension, and the second predetermined distance is chosen to be in the range of one and one-half to twice the second length dimension in order to maximize stress reduction at the first and second joints, respectively.

4. The multilayer circuit interconnection structure of claim 1 wherein said first stud comprises an S-type stud.

5. The multilayer circuit interconnection structure of claim 4 wherein said second stud comprises an L-type stud.

6. In an electrical component in which an end of a conducting line is connected to a contact area of a stud, the conducting line extending lengthwise along a first axis, and both the conducting line and stud are contained in a passivation layer, the improvement comprising:

an overhang of the connecting line end extending along the first axis a predetermined distance beyond the contact area, said predetermined distance being chosen so as to reduce thermal stress at the contact area while accommodating desired circuit density, said predetermined distance being in the range of one-quarter to twice a length dimension of said contact area, said length dimension being measured along said first axis; and wherein said conducting line end does not overhang said contact area in a width direction orthogonal to said first axis, whereby thermal stress at said contact area is reduced.

7. The improved electrical component of claim 6 wherein said predetermined distance is chosen to be in the range of one-quarter to one-half said length dimension in order to accommodate high circuit density.

8. The improved electrical component of claim 6 wherein said predetermined distance is chosen to be in the range of one and one-half to two times said length dimension in order to maximize stress reduction.

* * * * *